United States Patent [19]

Kawazoe et al.

[11] Patent Number: 5,342,468
[45] Date of Patent: Aug. 30, 1994

[54] JOINT FORMING SHEET OR TAPE AND METHOD FOR JOINT FORMATION USING THE SAME

[75] Inventors: Shozo Kawazoe; Hidehito Okano, both of Osaka, Japan

[73] Assignee: Nitto Denko Corporation, Osaka, Japan

[21] Appl. No.: 939,946

[22] Filed: Sep. 2, 1992

[30] Foreign Application Priority Data

Sep. 3, 1991 [JP] Japan .................. 3-253060

[51] Int. Cl.$^5$ ............................ H01R 43/00
[52] U.S. Cl. ..................... 156/233; 156/230; 156/239; 156/251; 428/545; 428/555; 428/615; 428/621; 29/825; 29/874
[58] Field of Search .............. 156/233, 239, 251; 428/545, 555, 615, 621

[56] References Cited

U.S. PATENT DOCUMENTS 4,606,962 8/1986 Reylek et al. ............ 428/148
5,001,302 3/1991 Atsumi ................... 174/94

FOREIGN PATENT DOCUMENTS 0303384 2/1989 European Pat. Off. .
3505115 8/1986 Fed. Rep. of Germany .
64-10578 1/1989 Japan .
WO8602204 4/1986 PCT Int'l Appl. .

*Primary Examiner*—David A. Simmons
*Assistant Examiner*—M. Curtis Mayes
*Attorney, Agent, or Firm*—Sughrue, Mion, Zinn, Macpeak & Seas

[57] ABSTRACT

A joint forming sheet comprising a substrate having an easy release surface having a contact angle with water of at least 50°, having provided on the easy release surface thereof an inorganic thin layer, the interfacial adhesive force of the inorganic thin layer to the substrate surface being greater than the tensile strength of the inorganic thin layer. The inorganic thin layer can be released and transferred to a part on which an electrical joint is to be formed with high precision to form a joint causing no electrical connection failure.

17 Claims, 1 Drawing Sheet

JOINT FORMING SHEET OR TAPE AND METHOD FOR JOINT FORMATION USING THE SAME

FIELD OF THE INVENTION

The present invention relates to a joint forming sheet or tape (hereinafter inclusively referred to as a "joint forming sheet") which is used for forming an electrical joint, for example, an electrical joint connecting a lead of an electronic part, such as a semiconductor laser and an IC chip, to an electrical circuit board, an electrical joint connecting a flat cable to a printed circuit board, and an external electrode of an electronic chip. The present invention also relates to a method for joint formation using the joint forming sheet or tape.

BACKGROUND OF THE INVENTION

Known joint forming sheets for electrical connection include a connecting sheet comprising a substrate with a easy release surface, such as a fluorine resin substrate, having provided thereon a low-melting metallic material layer as disclosed in JP-A-64-10578 and JP-A-64-10579 (the term "JP-A" as used herein means an "unexamined published Japanese patent application") and a connecting sheet comprising a substrate made of plastics other than fluorine resins having provided thereon a low-melting metallic material layer as disclosed in JP-A-64-63205.

An electrical joint can be formed by bringing the low-melting metallic material layer of a connecting sheet into contact with a part on which a joint is to be formed and pressing the layer from the back of the substrate with or without heat to thereby cut the pressed part of the metallic material layer and then transfer the cut part onto the part to be connected. Use of such a connecting sheet improves efficiency of electrical connection of various electrical or electronic parts.

However, where a metallic material layer is provided on an easy release surface of, for example, a fluorine resin substrate merely aiming at easy removal from the substrate, the pressed part of the metallic material layer tends to be released from the substrate before being cut. As a result, the transferred metallic layer would be oversized with poor dimensional precision. Such poor precision of transfer causes a failure of electrical connection.

On the other hand, where a metallic material layer is provided on a surface of a substrate made of plastics other than fluorine resins, since the metallic material layer is not easily released from the substrate at the adhesive interface, it tends to be broken in parts before being released, resulting in insufficient transfer. If the tensile strength of the metallic material layer is increased to avoid this, then the metallic material layer cannot be smoothly transferred, resulting in a reduction of workability.

Thus, the conventional techniques of joint formation by use of a connecting sheet have not yet achieved sufficient precision of transfer, waiting for further improvements.

SUMMARY OF THE INVENTION

As a result of extensive investigations, it has been now found that a sheet comprising a substrate with a specific easy release surface having provided thereon a thin layer having specific physical properties can overcome the problems in the prior art.

Accordingly, one object of the present invention is to provide a joint forming sheet with which an electrical joint can be formed with high precision of transfer.

Another object of the present invention is to provide a method for joint formation using the joint forming sheet or tape.

The joint forming sheet according to the present invention comprises a substrate having an easy release surface having a contact angle with water of at least 50°, having provided on the easy release surface thereof an inorganic thin layer, the adhesive force of the thin layer to the substrate surface being greater than the tensile strength of the thin layer.

The method for joint formation according to the present invention comprises putting the joint forming sheet or tape on a part on which an electrical joint is to be formed in a manner such that the inorganic thin layer faces the part, pressing the joint forming sheet from the back side thereof to cause the substrate to be partially deformed and to cause the inorganic thin layer at the pressed part to be cut and transferred to the part.

DETAILED DESCRIPTION OF THE INVENTION

The present invention will be described by referring to the accompanying drawings.

Figure 1:
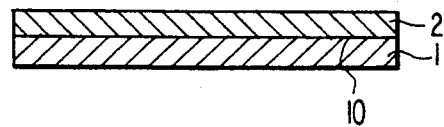
FIGS. 1 and 2 each shows a cross section of the joint forming sheet according to the present invention.

As shown in FIG. 1, the joint forming sheet of the present invention comprises a substrate 1 with an easy release surface 10 and an inorganic thin layer 2 provided on the surface 10.

The easy release surface 10 has a contact angle with water of at least 50°, and preferably at least 65°, so that the inorganic thin layer 2 may be released from the substrate 1 and transferred smoothly. If the contact angle is less than 50°, the inorganic thin layer 2 cannot easily be released from the substrate 1 at the adhesive interface therebetween. The upper limit of the contact angle with water is about 120°.

The easy release surface is obtained by forming the whole substrate of a fluorine resin, such as polytetrafluoroethylene, polychlorotrifluoroethylene, polyvinyl fluoride, polyvinylidene fluoride, a tetrafluoroethylene-hexafluoropropylene copolymer, or a chlorotrifluoroethylenevinylidene fluoride copolymer, or subjecting an ordinary plastic substrate to a surface treatment with a release agent, such as a silicone-containing compound having a hydroxyl group or a vinyl group (e.g., a blend of dimethyl polysiloxane and methylhydrogen polysiloxane), the above-described fluorine resin, or molybdenum sulfide.

The thickness of the substrate 1 is not particularly limited and usually ranges from about 1 to 600 μm. The substrate 1 is preferably rolled up so that the inorganic thin layer 2 can be formed thereon continuously in the longitudinal direction thereof and the substrate having formed thereon an inorganic thin layer can be unrolled to continuously conduct transfer of the thin layer onto various parts.

Materials constituting the inorganic thin layer 2 include not only the low-melting metallic materials described in JP-A-64-10578 and JP-A-64-10579 supra but high-melting metallic materials having a melting point of 500° C. or higher, e.g., gold, silver, copper, aluminum, nickel, chromium, iron, and silicon, or alloys thereof. In addition, the inorganic thin layer may be made of metal oxides or metal compounds, such as $Al_2O_3$, $SiO_{1-2}$, $TiO_{1-2}$, $Ta_2O_5$, ZnO, $WO_3$, ZnS, ZnSe, $SnO_2$, $In_2O_2$, GaAs, GaP, and CdO; or magnetic materials, such as amorphous magnetic alloys comprising Fe, Ni, Co, etc. having been doped with a semi-metal, e.g., B, P, or Si, and Fe—, Fe.Si—, Fe.Al—, Fe.Si.Al—, Fe.Cr—, Fe.Co—, Ni.Fe—, or Ni.Mn-based magnetic metals or alloys.

The inorganic thin layer 2 can be formed by known thin film formation techniques, such as vacuum evaporation, sputtering, and ion plating. The inorganic thin layer usually has a thickness of from about 50 Å to about 100 μm.

It is necessary for the inorganic thin layer 2 to have a greater interfacial adhesive force to substrate surface 10 than its tensile strength. The interfacial adhesive force is a pull strength ($g/cm^2$) of the thin layer when vertically pulled apart from the substrate and is measured as follows. A sample sheet cut to a 1 cm square was sandwiched in between a pair of plates with, for example, a double-coated adhesive tape. One of the plates is pulled with the other being fixed, and the load at which the inorganic thin layer is separated from the substrate is read out. The tensile strength of the thin layer is a tensile stress ($g/\mu m \times cm$) imposed to the cross section (thickness × width) of the thin layer at break.

With the interfacial adhesive strength between the inorganic thin layer 2 and the substrate surface 10 being greater than the tensile strength of the thin layer 2, the thin layer 2 undergoes cutting on being pressed from its back side before being released from the substrate 1 and is, therefore, transferred to part 3 with good dimensional precision. In order to take full advantage of such an effect, the interfacial adhesive force is preferably greater than the tensile strength of the thin layer by at least 10 g, and more preferably at least 50 g.

In general, since the tensile strength of the inorganic thin layer increases with an increase in thickness, it may exceed the interfacial adhesive force with a certain thickness. This can be avoided by previously subjecting the substrate to a surface treatment for enhancing the interfacial adhesion taking care not to impair easy release (i.e., so as to maintain a contact angle with water of 50° or more) or by controlling the thickness of the inorganic thin layer so that the tensile strength may not exceed the interfacial adhesive force. The surface treatment for enhancement of interfacial adhesion includes sputtering, corona discharge, irradiation of electron beams, alkali treatments, or etching (e.g., oxidation).

Where a high-melting metal having a melting point of 500° C. or higher is used as the inorganic thin layer, even those metals having relatively low surface energy will exert a sufficient interfacial adhesive force to an easy release surface having a contact angle with water of at least 50° because of their high evaporation energy. A thin layer made of a high-melting material exhibits an interfacial adhesive force higher than the tensile strength thereof usually by 10 g or more, and preferably 50 g or more. Accordingly, as compared with low-melting materials, high-melting materials having a melting point of 500° C. or higher are advantageous for easily satisfying the desired relationship between tensile strength and interfacial adhesive force without requiring the above-described manipulations such as a surface treatment of a substrate or control of thickness of an inorganic thin layer.

If the tensile strength of the inorganic thin layer is too low, the resulting sheet is hard to handle. If it is too high, cutting and transfer of the thin layer are difficult. Accordingly, a practical tensile strength of the thin layer is in the range of from 10 to 1,000 $g/\mu m \times cm$. On the other hand, if the interfacial adhesive force is too high, the thin layer is hardly released from the substrate. Accordingly, a practical interfacial adhesive force is not more than 300,000 $g/cm^2$, preferably 500 to 100,000 $g/cm^2$.

It is preferable that the substrate 1 has a greater elongation than that of the inorganic thin layer 2. It is also preferable that the substrate 1 has a controlled elongation in at least one direction.

If the elongation of the substrate 1 is smaller than that of the thin layer 2, when the substrate 1 is pressed and deformed by, for example, a push of an ejector as hereinafter described, such may cause nothing more than a stretch of the layer 2, failing to cut the layer 2 by the pushing force. In view of this, the elongation of the substrate 1 is preferably greater than that of inorganic thin layer 2 by at least 50%. An inorganic thin layer comprising the above-described metallic material usually has an elongation of not more than 100%. Accordingly, the substrate 1 preferably has an elongation of 150% or more, and more preferably 200% or more.

The elongation of the substrate 1 can be controlled in at least one direction by previously subjecting the substrate to stretching, for example, in its longitudinal direction in the case that the substrate has a continuous length (i.e., a sheet or tape form). More specifically, a substrate of continuous length preferably has an elongation of 150% or more, and more preferably 200% or more, in the transverse direction (TD) while controlling the elongation in the machine direction (MD) below 150%, and more preferably 120% or less.

The elongation of a substrate and an inorganic thin layer can be measured according to JIS K 6887.

Figure 4:
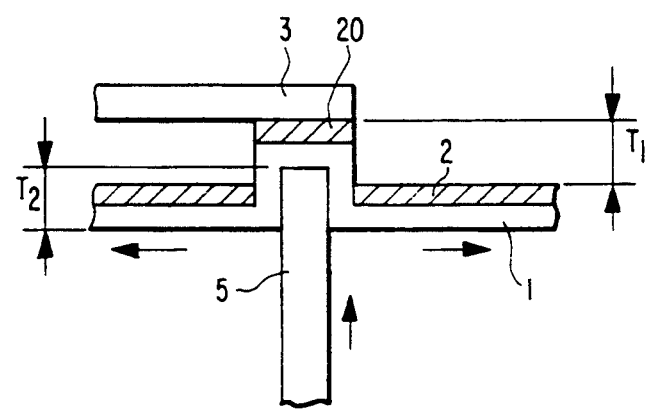

Since the substrate having a controlled longitudinal elongation is inhibited from elongation when a tension is applied thereto in the machine direction at the time of forming an inorganic thin layer thereon, unevenness in thickness of the formed inorganic thin layer and wrinkles of the resulting joint forming sheet can be prevented. Further, as shown in FIG. 4, when the thin layer 2 is made to face the surface of part 3 on which a joint is to be formed with tension F being imposed upon the substrate 1 in the direction having a controlled elongation (in the longitudinal reaction of the substrate 1 in FIG. 4), and the sheet is then deformed upon being pushed at the back side thereof by an ejector 5 (e.g., an ejector pin), the thin layer 2 is cut off along the outline of the ejector 5 and transferred to part 3 when the deformation exceeds the elongation of the thin layer 2 because the elongation of thin layer 2 is smaller than that of the substrate 1.

When the thin layer 2 of the joint forming sheet is made to face the surface of part 3, it is important for the gap ($T_1$) between thin layer 2 (before being deformed) and part 3 to be greater than the deformation distance ($T_2$) of the substrate 1 in its thickness direction at the time of cutting the thin layer 2 ($T_1 > T_2$). If $T_1$ is smaller than $T_2$, the thin layer 2 comes into contact with the surface of part 3 before it is cut off, resulting in insufficient precision of cutting.

Figure 2:
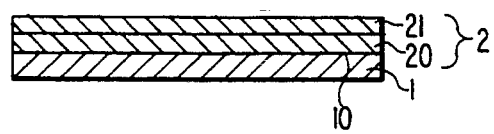

The inorganic thin layer may be composed of two or more layers as shown in FIG. 2. For example, it may be composed of a lower layer 20 made of a low-melting metallic material having a melting point of less than 500° C. and an upper layer 21 made of a high-melting metallic material having a melting point of 500° C. or higher, or vise versa, or may have a layer structure composed of layer 20, layer 21, and layer 20 in this order.

Such a laminate structure makes it possible to transfer different kinds of thin layers simultaneously and thus simplifies the working steps. For example, where a joint is formed of Sn, In, Pb, Ag, Al, or Cu, or an alloy thereof, a metallic barrier layer made of, e.g., Ni, is usually provided thereon by electroplating for the purpose of preventing an electrical connection failure due to migration. In such a case, the electrical joint and the barrier layer can be formed simultaneously by using a thin layer composed of a joint forming metallic layer and a barrier metallic layer, thereby excluding the necessity of electroplating after joint formation.

When the inorganic thin layer composed of a layer made of a low-melting material and a layer made of a high-melting material is transferred under heating, since the high-melting layer is not fused, the thin layer can be transferred while retaining its shape with high precision. When the transferred thin layer is fuse bonded by heating, the high-melting layer serves as a barrier layer against heat to prevent fusion of thin layers with each other.

Further, where a metal oxide or a metal compound having poor adhesion to a part on which a joint is to be formed is used as an inorganic thin layer, a metallic thin layer having good adhesion may be laminated on the metal oxide or metal compound layer to obtain satisfactory adhesion to the part.

The tensile strength of an inorganic thin layer composed of two or more layers is obtained as a tensile strength of the whole laminate.

In using the joint forming sheet according to the present invention, the inorganic thin layer of the sheet is brought into contact with a part on which a joint is to be formed and pressed onto the part from the back side of the substrate. Otherwise, a part on which a joint is to be formed is directly pressed onto the inorganic thin layer. Then, the inorganic thin layer at the pressed part is released from the substrate and, at the same time, transferred to the part, if desired, while applying energy, such as heat or ultrasonic waves.

Figure 3:
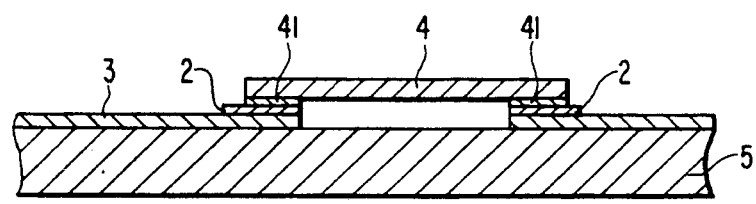
FIGS. 3 and 4 each illustrates the usage of the joint forming sheet according to the present invention.

An example of usage of the joint forming sheet of the present invention is illustrated in FIG. 3. Inorganic thin layer 2 is brought into contact with a circuit pattern 3 formed on an electrical circuit board 5, and the sheet is pressed, if desired, under heating from the back side thereof onto a pattern 3, whereby the thin layer 2 at the pressed part is transferred to the pattern 3. Then, an IC chip 4 is put thereon in such a manner that leads 41 of the chip 4 and the transferred thin layer 2 fit together and then fuse bonded while, if desired, applying heat or ultrasonic waves.

In another example of usage, a prescribed part of an IC chip is pressed onto the inorganic thin layer 2 of the joint forming sheet to transfer the thin layer 2 to the IC chip to form external electrodes (electrical joints).

Thus, the joints for electrical connection which can be formed by using the joint forming sheet of the present invention include the above-described circuit patterns, electrodes (pin electrodes or lead electrodes), and metallic bumps. The joint forming sheet of the invention is also useful for repair of disconnected circuit patterns.

According to the present invention, an inorganic thin layer is cut before being released from the substrate so that release and transfer of the thin layer to various parts can be achieved with high precision. Therefore, an electrical joint which causes no connection failure can be surely formed.

The present invention is now illustrated in greater detail with reference to Examples, but it should be understood that the present invention is not deemed to be limited thereto.

EXAMPLE 1

One side of a 50 μm thick polytetrafluoroethylene film (elongation in TD: 250%; elongation in MD: 117%; contact angle with water: 120°) was subjected to a sputtering surface treatment, and metallic indium was vacuum deposited thereon at $1\times 10^{-4}$ Torr to form a 5 μm thick indium layer. The indium layer had an elongation of 22%, a tensile strength of 135 g/5 μm×1 cm and an interfacial adhesive force of 2,000 g/cm² to the substrate.

An electrical joint was formed by using the resulting sheet in accordance with the usage shown in FIG. 3. The indium layer corresponding to the pressed part was neatly transferred to the circuit pattern with good dimensional precision leaving no remains on the substrate.

EXAMPLE 2

A joint forming sheet was prepared in the same manner as in Example 1, except for using an untreated substrate and replacing metallic indium with gold. The gold layer had a tensile strength of 645 g/5 μm×1 cm and an interfacial adhesive force of 1,000 g/cm².

When an electrical joint was formed by using the resulting sheet in the same manner as in Example 1, the gold layer corresponding to the pressed part was neatly transferred to the circuit pattern with good dimensional precision leaving no remains on the substrate.

While the invention has been described in detail and with reference to specific examples thereof, it will be apparent to one skilled in the art that various changes and modifications can be made therein without departing from the spirit and scope thereof.

What is claimed is:

1. A joint forming sheet or tape comprising a substrate having an easy release surface having a contact angle with water of at least 50°, having provided on said easy release surface thereof an inorganic thin layer, the interfacial adhesive force of said inorganic thin layer to said substrate easy release surface being greater than the tensile strength of said thin layer and the elongation of said substrate being greater than that of said thin layer,
    wherein said substrate having an easy release surface has an elongation in the transverse direction greater than that in the machine direction.

2. A joint forming sheet or tape as claimed in claim 1, wherein said inorganic thin layer has an interfacial adhesive force to the substrate surface of not more than 300,000 g/cm².

3. A joint forming sheet or tape as claimed in claim 1, wherein said inorganic thin layer has a tensile strength of from 10 to 10,000 g/μm×cm.

4. A joint forming sheet or tape as claimed in claim 1, wherein the interfacial adhesive force of said inorganic thin layer to the substrate surface is greater than the tensile strength of said inorganic thin layer by at least 10 g.

5. A joint forming sheet or tape as claimed in claim 1, wherein said inorganic thin layer is formed of an inorganic material having a melting point of 500° C. or higher.

6. A joint forming sheet or tape as claimed in claim 1, wherein said inorganic thin layer comprises a magnetic metal or an alloy.

7. A joint forming sheet or tape as claimed in claim 1, wherein said inorganic thin layer comprises two or more layers.

8. A joint forming sheet or tape as claimed in claim 7, wherein said inorganic thin layer comprises a low-melting metallic thin layer and a high-melting metallic thin layer.

9. A joint forming sheet or tape as claimed in claim 7, wherein said inorganic thin layer comprises a low-melting metallic thin layer, a high-melting metallic thin layer, and a low-melting metallic thin layer in this order.

10. A joint forming sheet or tape as claimed in claim 1, wherein said substrate having an easy release surface has a controlled elongation in its longitudinal direction.

11. A method for forming an electrical joint, comprising putting a joint forming sheet or tape comprising a substrate having an easy release surface having a contact angle with water of at least 50°, having provided on said easy release surface thereof an inorganic thin layer, the interfacial adhesive force of said inorganic thin layer to said substrate easy release surface being greater than the tensile strength of said thin layer, on a part on which an electrical joint is to be formed in such a manner that said inorganic thin layer faces said part, pressing said joint forming sheet from the back side thereof to cause the substrate to be partially deformed and to cause the inorganic thin layer at the pressed part to be cut and transferred to said part, wherein said substrate having an easy release surface has an elongation in the transverse direction greater than that in the machine direction.

12. A method for forming an electrical joint as claimed in claim 11, wherein the inorganic thin layer faces the part on which an electrical joint is to be formed with a gap therebetween, said gap being greater than the deformation distance of the substrate in its thickness direction at which the inorganic thin layer is caused to be cut.

13. A method for forming an electrical joint as claimed in claim 11, wherein said electrical joint is a pin electrode.

14. A method for forming an electrical joint as claimed in claim 11, wherein said electrical joint is a circuit pattern.

15. A method for forming an electrical joint as claimed in claim 11, wherein said electrical joint is a metallic bump.

16. A method for forming an electrical joint as claimed in claim 11, wherein said electrical joint is a lead electrode.

17. A method for forming an electrical joint as claimed in claim 11, wherein said electrical joint is a disconnected part of an electrical circuit.

* * * * *